(12) United States Patent
Ukai et al.

(10) Patent No.: US 12,400,567 B2
(45) Date of Patent: Aug. 26, 2025

(54) CIRCUIT DEVICE, ELECTRO-OPTICAL DEVICE, AND ELECTRONIC APPARATUS

(71) Applicant: SEIKO EPSON CORPORATION, Tokyo (JP)

(72) Inventors: Shinya Ukai, Fujimi-machi (JP); Akira Morita, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 18/621,013

(22) Filed: Mar. 28, 2024

(65) Prior Publication Data
US 2024/0331598 A1 Oct. 3, 2024

(30) Foreign Application Priority Data
Mar. 30, 2023 (JP) ................................ 2023-054903

(51) Int. Cl.
*G09G 3/00* (2006.01)
*G01R 27/26* (2006.01)
*G09G 3/36* (2006.01)

(52) U.S. Cl.
CPC ......... *G09G 3/006* (2013.01); *G01R 27/2605* (2013.01); *G09G 3/3688* (2013.01); *G09G 2330/12* (2013.01)

(58) Field of Classification Search
None
See application file for complete search history.

(56) References Cited

U.S. PATENT DOCUMENTS

| | | | | |
|---|---|---|---|---|
| 5,434,569 A * | 7/1995 | Yung | .................... | H03M 1/1033 341/172 |
| 6,707,403 B1 * | 3/2004 | Hurrell | ............... | H03M 1/1061 341/172 |
| 7,924,209 B2 * | 4/2011 | Kuo | .................... | H03M 1/1061 341/172 |
| 8,018,238 B2 * | 9/2011 | Cormier, Jr. | ....... | G01R 27/2605 324/678 |
| 8,111,178 B2 * | 2/2012 | Liao | .................... | H03M 1/1047 341/172 |
| 9,093,412 B2 * | 7/2015 | Sun | .................... | G01R 31/2853 |
| 10,147,359 B2 * | 12/2018 | Morita | ................. | G09G 3/3283 |
| 10,187,047 B2 * | 1/2019 | Bogner | .................... | H03K 5/24 |
| 10,591,512 B2 * | 3/2020 | Bogner | ................. | G01R 15/06 |
| 11,355,926 B2 * | 6/2022 | Kim | .................... | H10D 89/811 |

(Continued)

FOREIGN PATENT DOCUMENTS

JP 2022115310 8/2022

*Primary Examiner* — Fred Tzeng
(74) *Attorney, Agent, or Firm* — JCIPRNET

(57) ABSTRACT

A control circuit couples a test capacitance element Cp and a node Test to a capacitance element Cm1-1 to be tested, and applies a voltage output from an operational amplifier circuit to the capacitance elements Cm1-1 and Cp and the node Test. Thereafter, the capacitance element Cp and the node Test are decoupled from the capacitance element Cm1-1 to be tested, the capacitance element and the node Test are coupled to the capacitance element Cm1-1, the charge accumulated in the capacitance element Cm1-1 is moved, a voltage Vref of a negative input-end (−) of a comparison circuit is set, and the capacitance element Cm1-1 is tested based on a signal output from the comparison circuit.

8 Claims, 10 Drawing Sheets

(56) References Cited

U.S. PATENT DOCUMENTS

| | | | | |
|---|---|---|---|---|
| 11,768,255 | B2 * | 9/2023 | Morita | G09G 3/3688 |
| | | | | 324/548 |
| 11,815,369 | B2 * | 11/2023 | Liao | G01R 27/2605 |
| 2007/0170931 | A1 * | 7/2007 | Snyder | G01R 27/2605 |
| | | | | 324/658 |
| 2008/0150858 | A1 * | 6/2008 | Nishi | H03F 3/4521 |
| | | | | 345/87 |
| 2017/0005655 | A1 * | 1/2017 | Vashishtha | H03K 19/0185 |
| 2018/0003761 | A1 * | 1/2018 | Conte | G01R 31/2882 |
| 2019/0131991 | A1 * | 5/2019 | Hsu | H03M 1/1023 |
| 2022/0236340 | A1 | 7/2022 | Morita et al. | |

* cited by examiner

[Test_A] [Test_B] [Test_A]

[Test_A]

[Test_B]

[Test_A]

[Test_A]

[Test_A] [Test_B]

[Test_A]

[Test_A] [Test_B] [Test_A]

[Test_A]

CIRCUIT DEVICE, ELECTRO-OPTICAL DEVICE, AND ELECTRONIC APPARATUS

The present application is based on, and claims priority from JP Application Serial Number 2023-054903, filed Mar. 30, 2023, the disclosure of which is hereby incorporated by reference herein in its entirety.

BACKGROUND

1. Technical Field

The present disclosure relates to, for example, a circuit device, an electro-optical device, and an electronic apparatus.

2. Related Art

As a technique for testing a capacitance element formed at a semiconductor substrate, particularly for testing a capacitance value, for example, a technique described in JP-A-2022-115310 can be cited. Specifically, the technique described in JP-A-2022-115310 discloses that different voltages are applied to a tested capacitance element, which is a test target, and a test capacitance element, and they are then electrically coupled to each other, and a capacitance value of the tested capacitance element is tested based on a voltage that changes due to movement of a charge.

However, in the technique described in JP-A-2022-115310, when the difference between the capacitance value of the tested capacitance element and the capacitance value of the test capacitance element is large, an amount of movement of the charges are small, and therefore, the voltage change is small. Therefore, there is a problem that the test cannot be stably performed.

SUMMARY

A circuit device according to one aspect of the present disclosure includes a first tested capacitance element, a second tested capacitance element, a first comparison circuit configured to compare a voltage at a first end and a voltage at a second end, a first test capacitance element provided between the first end and a fixed potential, a first operational amplifier circuit configured to output a voltage to a first output-end, and a control circuit, wherein the control circuit is configured to electrically couple the test capacitance element and the first end to the first tested capacitance element to apply a first voltage output from the first operational amplifier circuit to the first tested capacitance element, the test capacitance element, and the first end, electrically decouple the test capacitance element and the first end from the first tested capacitance element, electrically couple the test capacitance element and the first end to the first tested capacitance element to move a charge of the first tested capacitance element and set the second end to a first test voltage, test the first tested capacitance element based on the first comparison circuit, electrically couple the test capacitance element and the first end to the second tested capacitance element to apply a second voltage output from the first operational amplifier circuit to the second tested capacitance element, the test capacitance element, and the first end, electrically decouple the test capacitance element and the first end from the second tested capacitance element and the first output-end, electrically couple the test capacitance element and the first end to the second tested capacitance element to move a charge of the second tested capacitance element and set the second end to a second test voltage, and test the second tested capacitance element based on the first comparison circuit.

DESCRIPTION OF EMBODIMENTS

Hereinafter, preferred exemplary embodiments of the present disclosure will be described with reference to the drawings. Also, the embodiments described below do not unduly limit the content of the present disclosure described in the claims. In addition, not all the configurations described below are essential constituent elements of the present disclosure.

Figure 1:
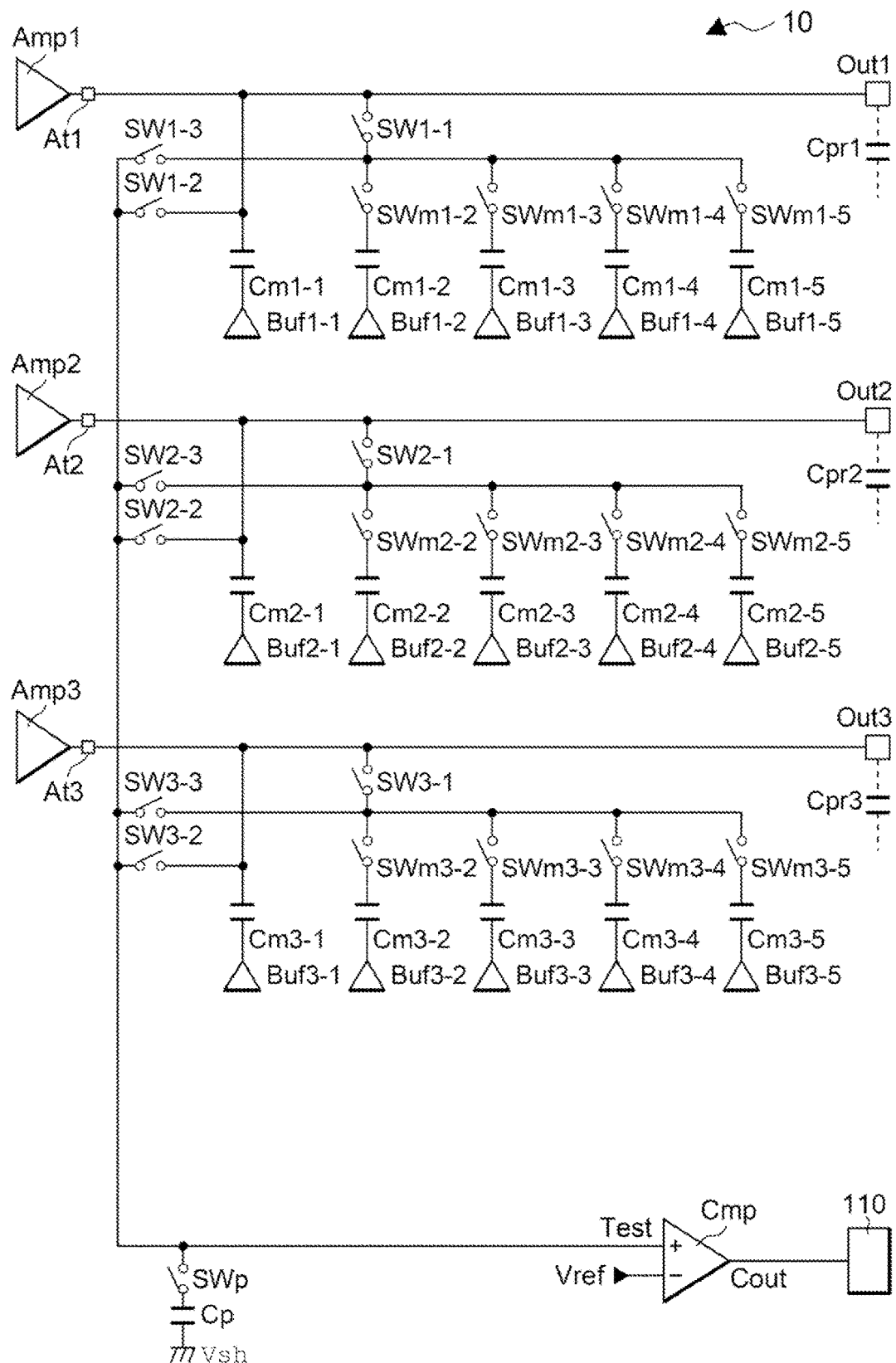
FIG. 1 is a circuit diagram of a periphery including a test circuit in a circuit device according to a first exemplary embodiment.

FIG. 1 is a diagram illustrating a peripheral circuit including a test circuit 10 in a circuit device according to a first exemplary embodiment. The test circuit 10 is a circuit that tests whether or not capacitance values of capacitance elements Cm1-1 to Cm1-5, Cm2-1 to Cm2-5, and Cm3-1 to Cm3-5 to be tested are within a predetermined range. The test circuit 10 is formed at the same semiconductor substrate together with the capacitance elements Cm1-1 to Cm1-5, Cm2-1 to Cm2-5, and Cm3-1 to Cm3-5 and other elements.

Among the capacitance elements to be tested, the capacitance elements Cm1-1 to Cm1-5 constitute a first set. In addition to the capacitance elements Cm1-1 to Cm1-5, the first set includes switches SW1-1 to SW1-3 and SWm1-2 to SWm1-5, an amplifier circuit Amp1, a switch At1, an output-end Out1, and buffers Buf1-1 to Buf1-5. The capacitance elements Cm2-1 to Cm2-5 constitute a second set. In addition to the capacitance elements Cm2-1 to Cm2-5, the second set includes switches SW2-1 to SW2-3 and SWm2-2 to SWm2-5, an amplifier circuit Amp2, a switch At2, an output-end Out2, and buffers Buf2-1 to Buf2-5.

The capacitance elements Cm3-1 to Cm3-5 constitute a third set. In addition to the capacitance elements Cm3-1 to Cm3-5, the third set includes switches SW3-1 to SW3-3 and SWm3-2 to SWm3-5, an amplifier circuit Amp3, a switch At3, an output-end Out3, and buffers Buf3-1 to Buf3-5.

In FIG. 1, three sets are illustrated for the sake of simplicity, but these sets are actually provided for each data line as will be described below.

In addition, the test circuit 10 includes a switch SWp, a capacitance element Cp, a comparison circuit Cmp, and a control circuit 110 which are common to each set.

Hereinafter, in the drawings, when a specific switch is not mentioned, the reference numeral of the switch is omitted. Similarly, when a specific buffer is not mentioned, the reference numeral of the buffer is omitted.

The capacitance values of the capacitance elements Cm1-1 to Cm1-5 are different from each other, for example. When the capacitance value of the capacitance element Cm1-1 is set to "1" for convenience, the capacitance values of the capacitance elements Cm1-2 to Cm1-5 are "½", "¼", "⅛", and "1/16" in order. Similarly, for other sets of capacitance elements Cm2-1 to Cm2-5 (Cm3-1 to Cm3-5), when the capacitance value of the capacitance element Cm2-1 (Cm3-1) is set to "1", the capacitance values of the capacitance elements Cm2-2 to Cm2-5 (Cm3-2 to Cm3-5) are "½", "¼", "⅛", and "1/16" in order.

The control circuit 110 individually controls an ON state or an OFF state of the switches and individually controls the buffers. In the present description, the ON state of the switch means that both ends of the switch are electrically closed to be in a low impedance state. Further, the OFF state of the switch means that both ends of the switch are electrically opened to be in a high impedance state.

The control circuit 110 selects one capacitance element to be inspected, and tests the capacitance value of the selected capacitance element. Further, the control circuit 110 individually controls the amplifier circuits Amp1 to Amp3. Further, the control circuit 110 sets a voltage Vref to be described below.

The amplifier circuit Amp1 outputs an arbitrary voltage according to the control of the control circuit 110. Under the control of the control circuit 110, the switch At1 couples the output-end of the amplifier circuit Amp1 to the output-end Out1 of the first set when the switch At1 is in the ON state, and electrically decouples the output-end of the amplifier circuit Amp1 from the output-end Out1 when the switch At1 is in the OFF state.

The buffers Buf1-1 to Buf1-5 output an H level or an L level under the control of the control circuit 110. The L level is a ground potential Vsh that is a reference of zero voltage, and the H level is, for example, a high-level voltage Vdh of the power supply voltage.

The output-end of the buffer Buf1-1 is coupled to one end of the capacitance element Cm1-1, and the other end of the capacitance element Cm1-1 is coupled to one end of the switch SW1-2 and the output-end Out1.

The output-end of the buffer Buf1-2 is coupled to one end of the capacitance element Cm1-2, and the other end of the capacitance element Cm1-2 is coupled to one end of the switch SW1-1 and the switch SW1-3 via the switch SWm1-2. The output-ends of the buffers Buf1-3 to Buf1-5 are coupled to one end of the capacitance elements Cm1-3 to Cm1-5 in order, and the other ends of the capacitance elements Cm1-2 to Cm1-5 are sequentially coupled to one end of the switch SW1-1 and the switch SW1-3 via the switches SWm1-3 to SWm1-5.

The other end of the switch SW1-2 and the other end of the switch SW1-3 are coupled to a positive input-end (+) of the comparison circuit Cmp.

In the present description, "coupled" means direct or indirect connection or coupling between two or more elements, and includes, for example, a case where two or more elements are not directly coupled to each other in a semiconductor substrate but are coupled to each other via different wiring layers and contact holes.

The positive input-end (+) of the comparison circuit Cmp is referred to as a node Test for convenience.

In the second set, the amplifier circuit Amp2 outputs an arbitrary voltage according to the control of the control circuit 110. Under the control of the control circuit 110, the switch At2 couples the output-end of the amplifier circuit Amp2 to the output-end Out2 of the second set when the switch At2 is in the ON state, and electrically decouples the output-end of the amplifier circuit Amp2 from the output-end Out2 when the switch At2 is in the OFF state.

The output-end of the buffer Buf2-1 is coupled to one end of the capacitance element Cm2-1, and the other end of the capacitance element Cm2-1 is coupled to one end of the switch SW2-2 and the output-end Out2.

The output-end of the buffer Buf2-2 is coupled to one end of the capacitance element Cm2-2, and the other end of the capacitance element Cm2-2 is coupled to one end of the switch SW2-1 and the switch SW2-3 via the switch SWm2-2. The output-ends of the buffers Buf2-3 to Buf2-5 are coupled to one end of the capacitance elements Cm2-3 to Cm2-5 in order, and the other ends of the capacitance elements Cm2-2 to Cm2-5 are sequentially coupled to one end of the switch SW2-1 and the switch SW2-3 via the switches SWm2-3 to SWm2-5.

The other end of the switch SW2-2 and the other end of the switch SW2-3 are coupled to the node Test.

Similarly, in the third set, the amplifier circuit Amp3 outputs an arbitrary voltage according to the control of the control circuit 110. Under the control of the control circuit 110, the switch At3 couples the output-end of the amplifier circuit Amp3 to the output-end Out3 of the third set when the switch At3 is in the ON state, and electrically decouples the output-end of the amplifier circuit Amp3 from the output-end Out3 when the switch At3 is in the OFF state.

The output-end of the buffer Buf3-1 is coupled to one end of the capacitance element Cm3-1, and the other end of the capacitance element Cm3-1 is coupled to one end of the switch SW3-2 and the output-end Out3.

The output-end of the buffer Buf3-2 is coupled to one end of the capacitance element Cm3-2, and the other end of the capacitance element Cm3-2 is coupled to one end of the switch SW3-1 and the switch SW3-3 via the switch SWm3-2. The output-ends of the buffers Buf3-3 to Buf3-5 are coupled to one end of the capacitance elements Cm3-3 to Cm3-5 in order, and the other ends of the capacitance elements Cm3-2 to Cm3-5 are sequentially coupled to one end of the switch SW3-1 and the switch SW3-3 via the switches SWm3-3 to SWm3-5.

The other end of the switch SW3-2 and the other end of the switch SW3-3 are coupled to the node Test.

One end of the capacitance element Cp is, for example, the ground potential Vsh. The other end of the capacitance element Cp is coupled to the node Test via the switch SWp. In the drawing, one set of the capacitance element Cp and the switch SWp is provided, but, for example, a plurality of sets are provided in parallel between the ground potential Vsh and the node Test, and the apparent capacitance value of the capacitance element Cp is made variable in accordance with the capacitance value to be tested.

The comparison circuit Cmp outputs the signal Cout at the H level when the voltage applied to the positive input-end (+) is equal to or higher than the voltage Vref applied to the negative input-end (−), and outputs the signal Cout at the L level when the voltage of the positive input-end (+) is lower than the voltage Vref.

The control circuit 110 determines, based on the signal Cout, whether or not the capacitance value of the capacitance element to be inspected at the present time is within a predetermined range.

When all of the switches At1, SW1-1, and SW1-2 are in the OFF state, a parasitic capacitance of the output-end Out1 is Cpr1. When all of the switches At2, SW2-1, and SW2-2 are in the OFF state, a parasitic capacitance of the output-end Out2 is Cpr2. Similarly, when all of the switches At3, SW3-1, and SW3-2 are in the OFF state, a parasitic capacitance of the output-end Out3 is Cpr3.

Next, the operation of the test circuit 10 according to the first exemplary embodiment will be described with reference to an example in which all the buffers are fixed at the L level (Vsh). First, the capacitance element Cm1-1 of the first set is to be tested.

In the following description, each switch is in the OFF state in principle, and is in the ON state when there is an instruction from the control circuit 110.

First, the control circuit 110 initializes the node Test and the capacitance element Cm1-1. In detail, the control circuit 110 turns on the switches At1 and SW1-2 and the switch SWp to cause the amplifier circuit Amp1 to output an initial voltage V1. Thus, the node Test is set to the initial voltage V1, and the initial voltage (V1-Vsh) is written to the capacitance elements Cm1-1 and Cp.

Next, the control circuit 110 writes a test voltage to the capacitance element Cm1-1 to be tested. More specifically, first, the control circuit 110 turns off the switch SW1-2 and causes the amplifier circuit Amp1 to output the voltage V2. Thus, the voltage (V2-Vsh) is written to the capacitance element Cm1-1. Second, the control circuit 110 turns off the switch At1.

Subsequently, the control circuit 110 redistributes the test voltage written to the capacitance element Cm1-1. More specifically, first, the control circuit 110 turns on the switch SW1-2. When the switch SW1-2 is turned on, charges are redistributed in a combined capacitance and the capacitance element Cm1-1 to be tested, so that the node Test has a voltage Vs expressed by the following equation (1).

The combined capacitance mentioned here is a sum of the capacitance value of the capacitance element Cp and the parasitic capacitance Cpr1 from the output-end Out1 to the switch SW1-2. Here, the capacitance value of the capacitance element Cp includes a parasitic capacitance from the switch SW1-2 to the node Test.

[Equation 1]

$$V_s = \frac{C_p \cdot V_1 + (C_{m1-1} + C_{pr1})V_2}{(C_p + C_{m1-1} + C_{pr1})} \quad (1)$$

Here if V1<V2, the control circuit 110 sets the voltage Vref to be applied to the negative input-end (−) of the comparison circuit Cmp to satisfy V1<Vref<Vs. Preferably, the control circuit 110 sets the voltage Vref to satisfy, for example, the following equation (2).

[Equation 2]

$$V_{ref} = V_1 + 0.9(V_s - V_1) \quad (2)$$

If the capacitance element Cm1-1 is normal, the signal Cout is at an H level, and if the capacitance element Cm1-1 is abnormal, the signal Cout is at an L level. Therefore, the control circuit 110 can test whether the capacitance element Cm1-1 is normal or abnormal based on the logic level of the signal Cout after the charge redistribution.

Next, the operation in the case where the capacitance element Cm1-2 of the first set is to be tested will be described. First, the control circuit 110 initializes the node Test and the capacitance element Cm1-2. In detail, the control circuit 110 turns off all the switches. Thereafter, the control circuit 110 turns on the switches At1, SW1-1, SW1-3, SWm1-2, and the switch SWp to cause the amplifier circuit Amp1 to output the initial voltage V1. As a result, the node Test is set to the initial voltage V1, and the initial voltage (V1-Vsh) is written to the capacitance elements Cm1-2 and Cp.

Next, the control circuit 110 writes a test voltage to the capacitance element Cm1-2 to be tested. More specifically, first, the control circuit 110 turns off the switch SW1-3 and causes the amplifier circuit Amp1 to output the voltage V2. Thus, the voltage (V2-Vsh) is written to the capacitance element Cm1-2. Then, second, the control circuit 110 turns off the switches At1 and SW1-1.

Subsequently, the control circuit 110 redistributes the test voltage written to the capacitance element Cm1-2. More specifically, first, the control circuit 110 turns on the switch SW1-3. When the switch SW1-3 is turned on, charges are redistributed in a combined capacitance and the capacitance element Cm1-2 to be tested, so that the node Test has a voltage Vs expressed by the following equation (3).

The combined capacitance mentioned here includes a parasitic capacitance from the other end of the capacitance element Cm1-2 to the node Test in addition to the capacitance value of the capacitance element Co.

[Equation 3]

$$V_s = \frac{C_p \cdot V_1 + C_{m1-2} \cdot V_2}{(C_p + C_{m1-2})} \quad (3)$$

Here the control circuit 110 sets the voltage Vref applied to the negative input-end (−) of the comparison circuit Cmp to satisfy
V1<Vref<Vs. Preferably, the control circuit 110 sets the voltage Vref to satisfy the above equation (2).

If the capacitance element Cm1-2 is normal, the signal Cout is at an H level, and if the capacitance element Cm1-2 is abnormal, the signal Cout is at an L level. Therefore, the control circuit 110 can test whether the capacitance element Cm1-2 is normal or abnormal based on the logic level of the signal Cout after the charge redistribution.

The operation in the case where the capacitance elements Cm1-3, Cm1-4, and Cm1-5 of the first set are to be tested is the same as the operation of testing the capacitance elements Cm1-2. Specifically, in the case where the capacitance element Cm1-$i$ is tested where i is an integer of 3, 4, or 5 indicating the ordinal number of the capacitance element, "2" after the hyphen "-" is replaced with "i" in the operation of testing the capacitance element Cm1-2.

In the equation (1) used for the test of the capacitance element Cm1-1, the parasitic capacitance Cpr1 of the output-end Out1 occurs. However, since the capacitance value of the capacitance element Cm1-1 is large, the capacitance element Cm1-1 is hardly affected by the parasitic capacitance Cpr1. In addition, the capacitance value of the capacitance element Cp is set to be substantially the same as the capacitance value of the capacitance element Cm1-1, whereby the amount of charge transfer at the time of redistribution can be increased. For this reason, since the amount of fluctuation in the voltage in the test of the capacitance element Cm1-1 increases, the accuracy of the test is improved.

On the other hand, in the test of the capacitance elements Cm1-2 to Cm1-5, the switch SW1-1 is in the OFF state in the charge redistribution. Therefore, the parasitic capacitance Cpr1 of the output-end Out1 does not occur in the equation (3) used for the test of the capacitance elements Cm1-2 to Cm1-5. The capacitance elements Cm1-2 to Cm1-5 are smaller than the capacitance elements Cm1-1, but are not affected by the parasitic capacitance Cpr1.

In addition, the capacitance value of the capacitance element Cp is set to be substantially the same as the capacitance value to be tested among the capacitance elements Cm1-2 to Cm1-5, whereby the amount of charge transfer at the time of redistribution can be increased. Therefore, the accuracy of the test of the capacitance elements Cm1-2 to Cm1-5 is improved.

Therefore, in the present exemplary embodiment, when a plurality of capacitance elements having different capacitance values are tested, both a capacitance element having a large capacitance value and a capacitance element having a small capacitance value can be tested with high accuracy.

In this description, the test of the capacitance elements Cm1-1 to Cm1-5 constituting the first set has been described, but the operation of testing the capacitance elements Cm2-1 to Cm2-5 of the second set and the capacitance elements Cm3-1 to Cm3-5 of the third set, other than the first set, is the same as the operation of testing the capacitance elements Cm1-1 to Cm1-5 of the first set. Specifically, when the capacitance elements Cmj-1 to Cmj-5 of the j-th set of are tested with j as an integer of 2 or 3 indicating a group, "1" before the hyphen "-" is replaced with "j" in the operation of the first group of capacitance elements Cm1-1 to Cm1-5.

In this description, all the buffers are fixed at the L level, but the voltage at one end of the capacitance element to be tested may be changed by the buffer coupled to the one end of the capacitance element. An example of this case will be described first assuming that the capacitance element Cm1-1 is to be tested.

First, the control circuit 110 initializes the node Test and the capacitance element Cm1-1. More specifically, the control circuit 110 turns off all the switches and causes all the buffers to output the L level (Vsh). Thereafter, the control circuit 110 turns on the switches At1 and SW1-2 and the switch SWp to cause the amplifier circuit Amp1 to output the initial voltage V1. Thus, the node Test is set to the initial voltage V1, and the initial voltage (V1-Vsh) is written to the capacitance elements Cm1-1 and Cp.

Next, the control circuit 110 turns off the switch At1 to change the output of the buffer Buf1-1 from the L level to the H level (Vdh). While the one end of the capacitance element Cm1-1 changes from the L level to the H level, the switch SW1-2 and the switch SWp are maintained in the ON state. Therefore, the charges flow out from the capacitance element Cm1-1, and the charges are redistributed in the combined capacitance and the capacitance element Cm1-1 to be tested. The combined capacitance mentioned here is the sum of the capacitance value of the capacitance element Cp and the parasitic capacitance Cpr1 from the output-end Out1 to the switch SW1-2, and the capacitance value of the capacitance element Cp includes the parasitic capacitance from the switch SW1-2 to the node Test.

Thereafter, the control circuit 110 sets the voltage Vref to the following equation (4).

[Equation 4]

$$V_{ref} = \frac{(C_p + C_{m1-1} + C_{pr})V_1 + 0.9 C_{m1-1}(V_{dh} - V_{sh})}{(C_p + C_{m1-1} + C_{pr1})} \quad (4)$$

The control circuit 110 can test whether the capacitance element Cm1-1 is normal or defective based on the logic level of the signal Cout after the charge redistribution.

In the equation (4), the term (Vdh-Vsh) indicating the voltage change is affected only by the capacitance value of the capacitance element Cm1-1 and is not affected by the parasitic capacitance Cpr1. Therefore, the voltage Vs of the node Test has a value that accurately reflects the capacitance value of the capacitance element Cm1-1.

Next, the case where the capacitance element Cm1-2 is to be tested will be described.

First, the control circuit 110 initializes the node Test and the capacitance element Cm1-2. More specifically, the control circuit 110 turns off all the switches and causes all the buffers to output the L level (Vsh). Thereafter, the control circuit 110 turns on the switches At1, SW1-1, SW1-3, SWm1-2, and the switch SWp to cause the amplifier circuit Amp1 to output the initial voltage V1. As a result, the node Test is set to the initial voltage V1, and the initial voltage (V1-Vsh) is written to the capacitance elements Cm1-2 and Cp.

Next, the control circuit 110 turns off the switch SW1-1 and changes the output of the buffer Buf1-1 from the L level to the H level (Vdh). While the one end of the capacitance element Cm1-2 changes from the L level to the H level, the switches SW1$m$-2 and SW1-3 and the switch SWp are maintained in the ON state. Therefore, the charge flows out from the capacitance element Cm1-2, and the charges are redistributed in the combined capacitance and the capacitance element Cm1-2 to be tested. The combined capacitance mentioned here includes a parasitic capacitance from the other end of the capacitance element Cm1-2 to the node Test in addition to the capacitance value of the capacitance element Cp, but does not include the parasitic capacitance Cpr1 because the switch SW1-1 is in the OFF state.

As a result of the charge redistribution, the node Test has a voltage Vs expressed by the following equation (5).

[Equation 5]

$$V_s = \frac{C_p \cdot V_1 + C_{m1-2}(V_{dh} - V_{sh})}{(C_p + C_{m1-2})} \quad (5)$$

When the voltage Vref is 90% of the voltage Vs, the control circuit 110 sets the voltage Vref expressed by the following equation (6).

[Equation 6]

$$V_{ref} = 0.9 \frac{C_p \cdot V_1 + C_{m1-2}(V_{dh} - V_{sh})}{(C_p + C_{m1-2})} \quad (6)$$

After the charge redistribution, the control circuit 110 can test whether the capacitance element Cm1-2 is normal or abnormal depending on the logic level of the signal Cout.

The operation in the case where the capacitance elements Cm1-3, Cm1-4, and Cm1-5 of the first set are to be tested is the same as the operation of testing the capacitance elements Cm1-2.

In the test of the capacitance elements Cm1-2 to Cm1-5, the switch SW1-1 is in the OFF state in the charge redistribution. Therefore, the parasitic capacitance Cpr1 does not occur in the equation (5) and the equation (6) used for the test of the capacitance elements Cm1-2 to Cm1-5. Therefore, in the test of the capacitance elements Cm1-2 to Cm1-5, the voltage Vs of the node Test has a value that accurately reflects the capacitance values of the capacitance elements Cm1-2 to Cm1-5.

Figure 2:
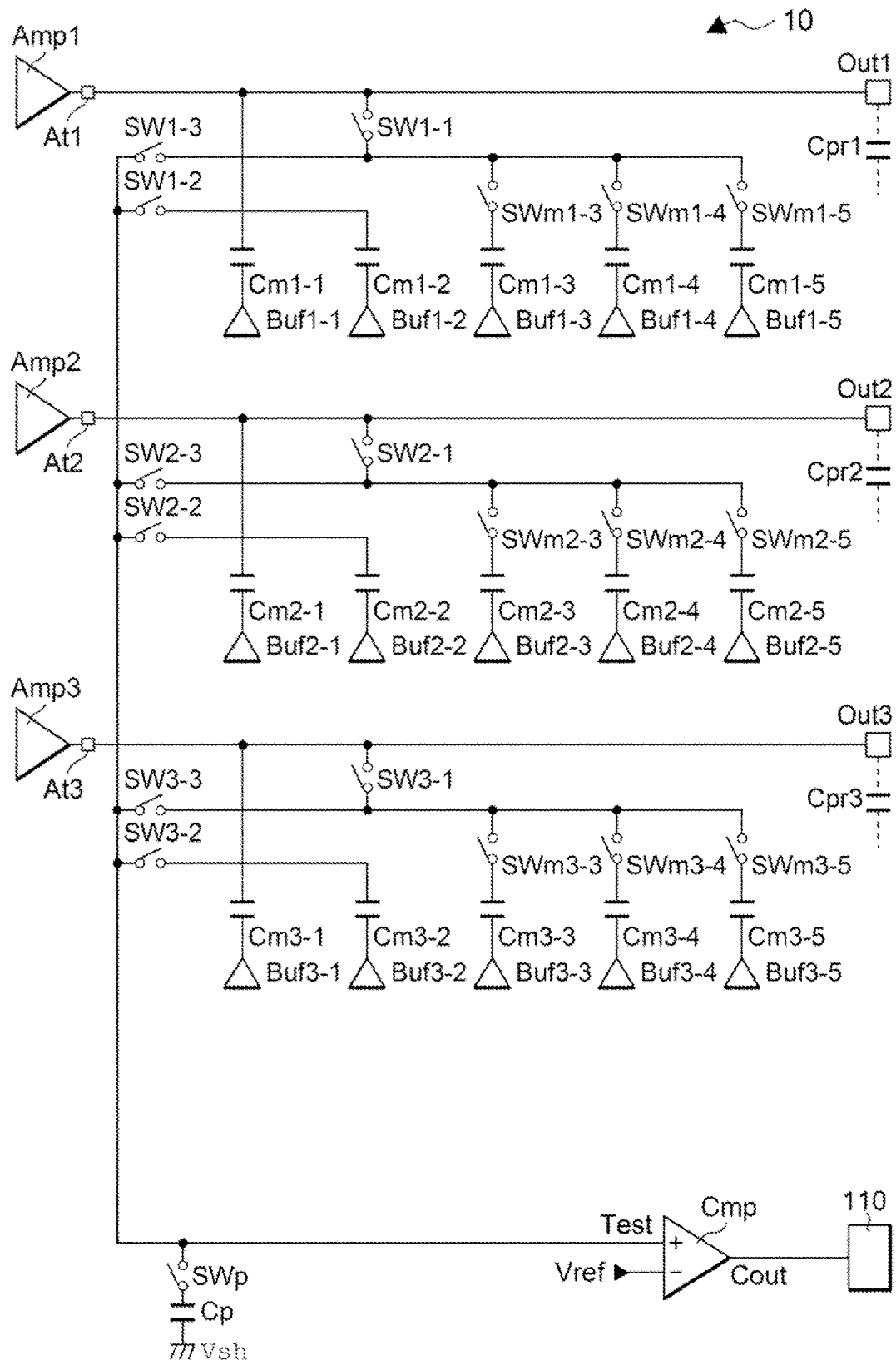
FIG. 2 is a circuit diagram of a periphery including a test circuit in a circuit device according to a modification of the first exemplary embodiment.

The first exemplary embodiment illustrated in FIG. 1 has a configuration in which one end of the switch SW1-2 in the first set is coupled to the other end of the capacitance element Cm1-1. Similarly, one end of the switch SW2-2 in the second set is coupled to the other end of the capacitance element Cm2-1, and one end of the switch SW3-2 in the third set is coupled to the other end of the capacitance element Cm3-1. The first exemplary embodiment is not limited to such a configuration, and as illustrated in FIG. 2, a configuration in which the other end of the capacitance element Cm1-2 is coupled to one end of the switch SW1-2 may be adopted. Similarly, one end of the switch SW2-2 is coupled to the other end of the capacitance element Cm2-2, and one end of the switch SW3-2 is coupled to the other end of the capacitance element Cm3-2.

In the configuration illustrated in FIG. 2, the test of the capacitance element Cm1-2 (Cm2-2, Cm3-2) is the same operation as the test of the capacitance element Cm1-1 (Cm2-1, Cm3-1) in the configuration illustrated in FIG. 1. Further, in the configuration illustrated in FIG. 2, the test of the capacitance elements Cm1-3 and subsequent elements (Cm2-3, Cm3-3 and subsequent elements) is the same operation as the test of the capacitance elements Cm1-2 and subsequent elements (Cm2-2, Cm3-2 and subsequent elements) in the configuration illustrated in FIG. 1.

Figure 3:
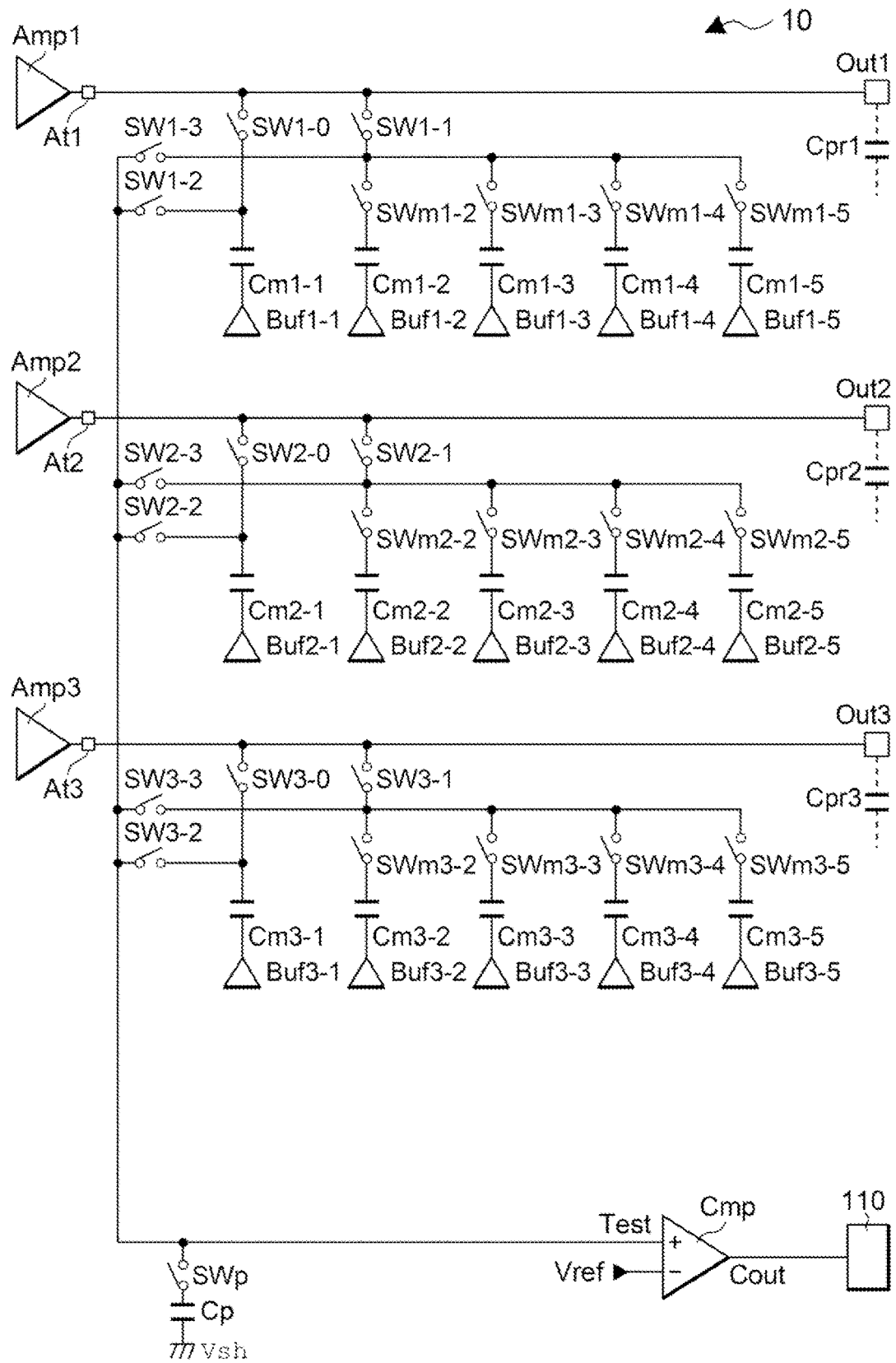
FIG. 3 is a circuit diagram of a periphery including a test circuit in a circuit device according to a second exemplary embodiment.

Next, a second exemplary embodiment is described. FIG. 3 is a diagram illustrating a peripheral circuit including the test circuit 10 in the circuit device according to the second exemplary embodiment.

The configuration illustrated in FIG. 3 is different from the configuration illustrated in FIG. 1 in the following three points. That is, first, a switch Cm1-0 is interposed between the other end of the capacitance element Cm1-1 (one end of the switch SW1-2) and the output-end Out1, second, a switch SW2-0 is interposed between the other end of the capacitance element Cm2-1 (one end of the switch SW2-2) and the output-end Out2, and third, a switch SW3-0 is interposed between the other end of the capacitance element Cm3-1 (one end of the switch SW3-2) and the output-end Out3.

Next, the operation of the test circuit 10 according to the second exemplary embodiment will be described by taking, as an example, a case where all the buffers are fixed at the L level (Vsh) and the target of the test is the capacitance element Cm1-1.

First, the control circuit 110 initializes the node Test and the capacitance element Cm1-1. In detail, the control circuit 110 turns off all the switches. Thereafter, the control circuit 110 turns on the switches At1, SW1-0, SW1-2, and the switch SWp to cause the amplifier circuit Amp1 to output the initial voltage V1. Thus, the node Test is set to the initial voltage V1, and the initial voltage (V1-Vsh) is written to the capacitance elements Cm1-1 and Cp.

Next, the control circuit 110 writes a test voltage to the capacitance element Cm1-1 to be tested. More specifically, first, the control circuit 110 turns off the switch SW1-2 and causes the amplifier circuit Amp1 to output the voltage V2. Thus, the voltage (V2-Vsh) is written to the capacitance element Cm1-1. Second, the control circuit 110 turns off the switch SW1-0.

Subsequently, the control circuit 110 redistributes the test voltage written to the capacitance element Cm1-1. In detail, the control circuit 110 turns on the switch SW1-2. When the switch SW1-2 is turned on, charges are redistributed in a combined capacitance and the capacitance element Cm1-1 to be tested, so that the node Test has a voltage Vs expressed by the following equation (7). The combined capacitance mentioned here includes a parasitic capacitance from the other end of the capacitance element Cm1-1 to the node Test in addition to the capacitance value of the capacitance element Cp.

[Equation 7]

$$V_s = \frac{C_p \cdot V_1 + C_{m1-1} \cdot V_2}{(C_p + C_{m1-1})} \quad (7)$$

Here the control circuit 110 sets the voltage Vref applied to the negative input-end (−) of the comparison circuit Cmp to satisfy V1<Vref<Vs. Preferably, the control circuit 110 sets the voltage Vref to satisfy the above equation (2).

If the capacitance element Cm1-1 is normal, the signal Cout is at an H level, and if the capacitance element Cm1-1 is abnormal, the signal Cout is at an L level. Therefore, the control circuit 110 can test whether the capacitance element Cm1-1 is normal or abnormal based on the logic level of the signal Cout after the charge redistribution.

In this example, when the charges are redistributed in the test of the capacitance element Cm1-1, since the switch SW1-0 is in the OFF state, there is no influence of the parasitic capacitance Cpr1 of the output-end Out1. To be specific, unlike the equation (1), the equation (7) is not affected by the parasitic capacitance Cpr1. Therefore, the voltage Vs of the node Test has a value that accurately reflects the capacitance value of the capacitance element Cm1-1.

The capacitance elements Cm1-2 to Cm1-5 are tested in the same manner as in the first exemplary embodiment. In addition, the test of the capacitance elements Cm2-1 to Cm2-5 of the second set and the capacitance elements Cm3-1 to Cm3-5 of the third set is the same as the test of the capacitance elements Cm1-1 to Cm1-5 of the first set.

Also in the second exemplary embodiment, the voltage at the one end of the capacitance element to be tested may be changed by the buffer coupled to the one end of the capacitance element. An example of this case will be described first assuming that the capacitance element Cm1-1 is to be tested.

First, the control circuit 110 initializes the node Test and the capacitance element Cm1-1. More specifically, the control circuit 110 turns off all the switches and causes all the buffers to output the L level (Vsh). Thereafter, the control circuit 110 turns on the switches At1, SW1-0, SW1-2, and the switch SWp to cause the amplifier circuit Amp1 to output the initial voltage V1. Thus, the node Test is set to the initial voltage V1, and the initial voltage (V1-Vsh) is written to the capacitance elements Cm1-1 and Cp.

Next, the control circuit 110 turns off the switch SW1-0 and changes the output of the buffer Buf1-1 from the L level to the H level (Vdh). While the one end of the capacitance element Cm1-1 changes from the L level to the H level, the switch SW1-2 and the switch SWp are maintained in the ON state. Therefore, the charges flow out from the capacitance element Cm1-1, and the charges are redistributed in the combined capacitance and the capacitance element Cm1-1 to be tested.

As a result of the charge redistribution, the node Test has a voltage Vs expressed by the following equation (8).

[Equation 8]

$$V_s = \frac{C_p \cdot V_1 + C_{m1-1}(V_{dh} - V_{sh})}{(C_p + C_{m1-1})} \quad (8)$$

If the voltage Vref is 90% of the voltage Vs, the control circuit 110 sets the voltage Vref expressed by the following equation (9).

[Equation 9]

$$V_{ref} = 0.9 \frac{C_p \cdot V_1 + C_{m1-1}(V_{dh} - V_{sh})}{(C_p + C_{m1-1})} \quad (9)$$

The control circuit 110 can test whether the capacitance element Cm1-1 is normal or defective based on the logic level of the signal Cout after the charge redistribution.

The capacitance elements Cm1-2 to Cm1-5 are tested in the same manner as in the first exemplary embodiment. In addition, the test of the capacitance elements Cm2-1 to Cm2-5 of the second set and the capacitance elements Cm3-1 to Cm3-5 of the third set is the same as the test of the capacitance elements Cm1-1 to Cm1-5 of the first set.

Figure 4:
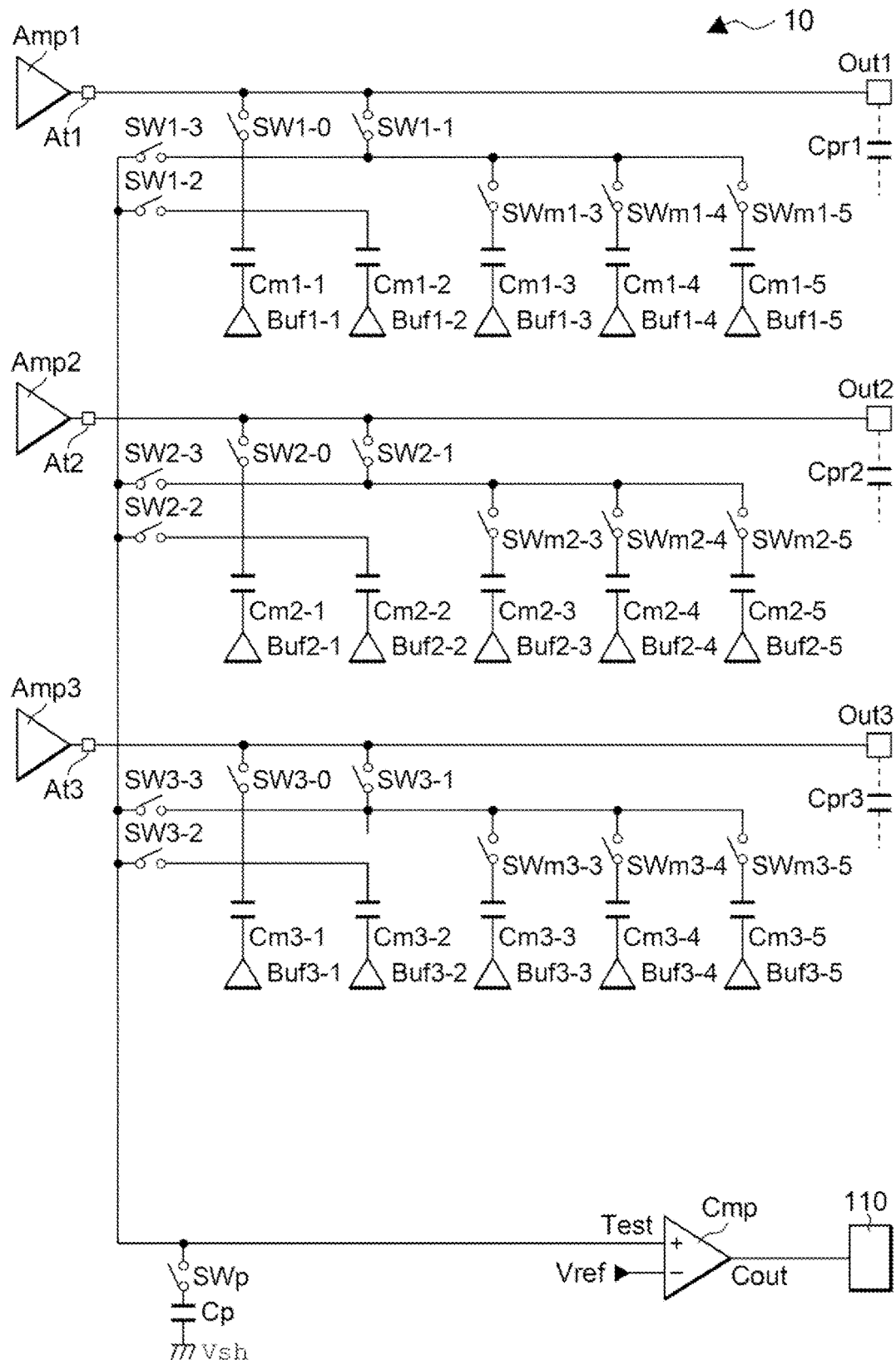
FIG. 4 is a circuit diagram of a periphery including a test circuit in a circuit device according to a modification of the second exemplary embodiment.

The second exemplary embodiment illustrated in FIG. 3 has a configuration in which the other ends of the capacitance elements Cm1-1, Cm2-1, and Cm3-1 are sequentially coupled to one end of the switches SW1-2, SW2-2, and SW3-2. As illustrated in FIG. 4 similar to FIG. 2 in the first exemplary embodiment, one end of the switch SW2-2 may be coupled to the other end of the capacitance element Cm2-1, and one end of the switch SW3-2 in the third set may be coupled to the other end of the capacitance element Cm3-1.

In the configuration illustrated in FIG. 4, the test of the capacitance element Cm1-2 (Cm2-2, Cm3-2) is the same operation as the test of the capacitance element Cm1-1 (Cm2-1, Cm3-1) in the configuration illustrated in FIG. 3. Further, in the configuration illustrated in FIG. 4, the test of the capacitance elements Cm1-3 and subsequent elements (Cm2-3, Cm3-3 and subsequent elements) is the same operation as the test of the capacitance elements Cm1-2 and subsequent elements (Cm2-2, Cm3-2 and subsequent elements) in the configuration illustrated in FIG. 3.

Figure 5:
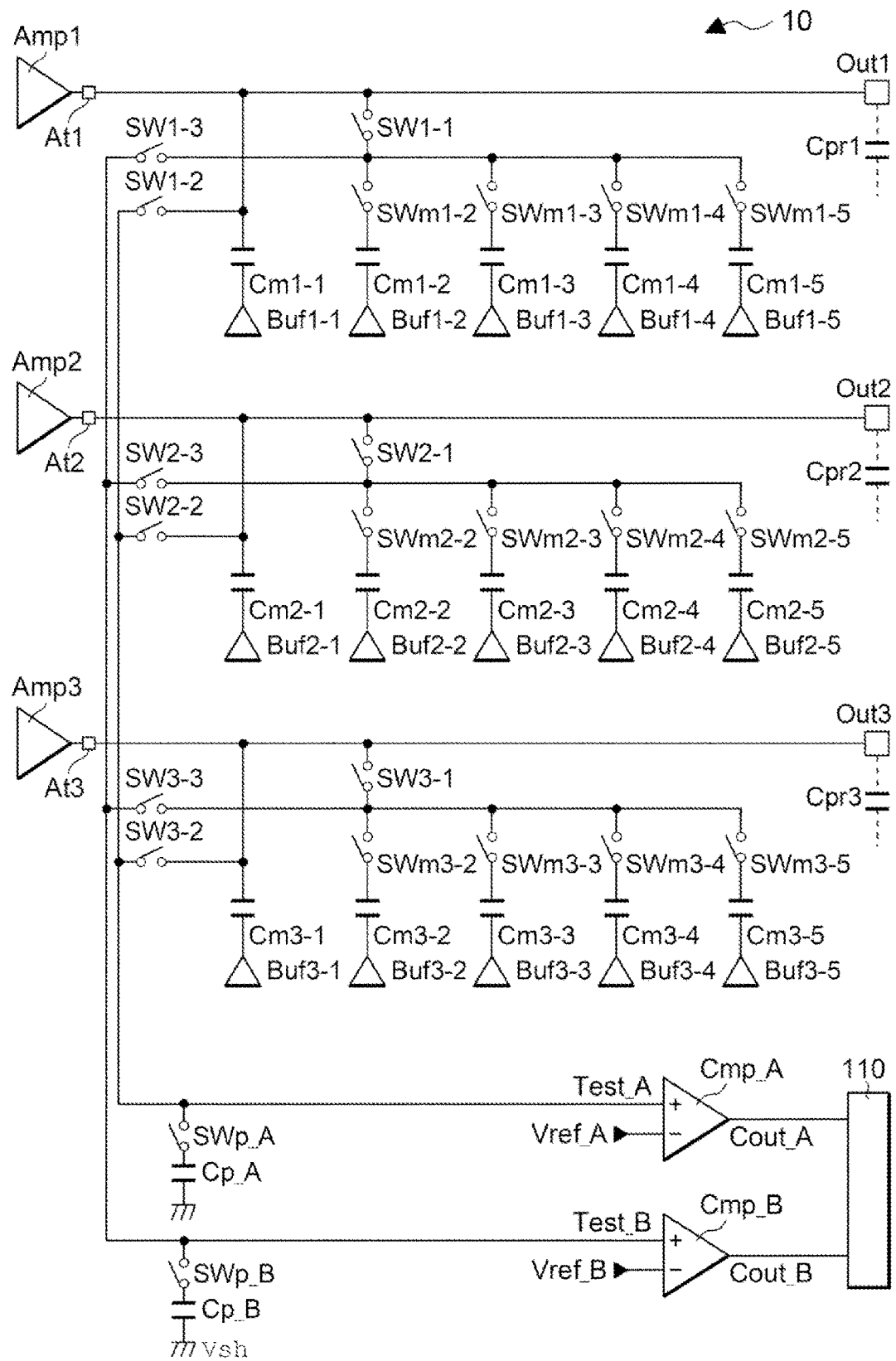
FIG. 5 is a circuit diagram of a periphery including a test circuit in a circuit device according to a third exemplary embodiment.

Next, a third exemplary embodiment is described. FIG. 5 is a diagram illustrating a peripheral circuit including the test circuit 10 in the circuit device according to the third exemplary embodiment.

The configuration illustrated in FIG. 5 is different from the configuration illustrated in FIG. 1 in that a node to which the other ends of the switches SW1-2, SW2-2, and SW3-2 are coupled and a node to which the other ends of the switches SW1-3, SW2-3, and SW3-3 are coupled are independent of each other, and two systems of comparison circuits Cmp_A and Cmp_B are provided.

In detail, the other ends of the switches SW1-2, SW2-2, and SW3-2 are coupled to the positive input-end (+) of the comparison circuit Cmp_A. A voltage Vref_A specified by the control circuit 110 is applied to a negative input-end (−) of the comparison circuit Cmp_A. Further, the positive input-end (+) of the comparison circuit Cmp_A is referred to as a node Test_A for convenience.

The comparison circuit Cmp_A outputs a signal Cout_A at the H level when the voltage of the node Test_A is equal to or higher than the voltage Vref_A, and outputs a signal Cout_A at the L level when the voltage of the node Test_A is lower than the voltage Vref_A.

A series coupling of a capacitance element Cp_A and a switch SWp A is interposed between the ground potential Vsh and the node Test_A. In the drawing, one set of the capacitance element Cp_A and the switch SWp A is provided, but, for example, a plurality of sets are provided in parallel between the ground potential Vsh and the node Test_A, and the apparent capacitance value of the capacitance element Cp_A is made variable in accordance with the capacitance value to be tested.

The other ends of the switches SW1-3, SW2-3, and SW3-3 are coupled to the positive input-end (+) of the comparison circuit Cmp_B. A voltage Vref_B specified by the control circuit 110 is applied to a negative input-end (−) of the comparison circuit Cmp_B. Further, the positive input-end (+) of the comparison circuit Cmp_B is referred to as a node Test_B for convenience.

The comparison circuit Cmp_B outputs a signal Cout_B at the H level when the voltage of the node Test_B is equal to or higher than the voltage Vref_B, and outputs a signal Cout_B at the L level when the voltage of the node Test_B is lower than the voltage Vref_B.

A series coupling of a capacitance element Cp_B and a switch SWp_B is interposed between the ground potential Vsh and the node Test_A. Although the capacitance element Cp_B and the switch SWp_B are provided as one set in the drawing, for example, a plurality of sets are provided in parallel between the ground potential Vsh and the node Test_B, and the apparent capacitance value of the capacitance element Cp_B is made variable in accordance with the capacitance value to be tested.

Next, the operation of the test circuit 10 according to the third exemplary embodiment will be described by taking, as an example, a case where all the buffers are fixed at the L level (Vsh) and the targets of the test are two capacitance elements Cm1-1 and Cm1-2.

First, the control circuit 110 initializes the nodes Test_A and Test_B and the capacitance elements Cm1-1 and Cm1-2. In detail, the control circuit 110 turns off all the switches. Thereafter, the control circuit 110 turns on the switches At_1, SW1-1, SW1-2, SW1-3, SWm1-2, SWp_A, and SWp_B to cause the amplifier circuit Amp1 to output the initial voltage V1. Accordingly, the nodes Test_A and Test_B are set to the initial voltage V1, and the initial voltage (V1-Vsh) is written to the capacitance elements Cm1-1, Cm1-2, and Cp.

Next, the control circuit 110 writes a test voltage to the capacitance elements Cm1-1 and Cm1-2 to be tested. More specifically, first, the control circuit 110 turns off the switches SW1-2 and SW1-3 and causes the amplifier circuit Amp1 to output the voltage V2. Thus, the voltage (V2-Vsh) is written to each of the capacitance elements Cm1-1 and Cm1-2. Second, the control circuit 110 turns off the switch SW1-1.

Subsequently, the control circuit 110 redistributes the test voltage written to the capacitance elements Cm1-1 and Cm1-2. In detail, the control circuit 110 turns on the switches SW1-2 and SW1-3.

When the switch SW1-2 is turned on, the charges are redistributed between the combined capacitance and the capacitance element Cm1-1 to be tested, so that the node Test_A has a voltage obtained by replacing the voltage Vs in the equation (1) with Vs_A.

When the switch SW1-3 is turned on, the charges are redistributed between the combined capacitance and the capacitance element Cm1-2 to be tested, so that the node Test_B has a voltage obtained by replacing the voltage Vs in the equation (3) with Vs_B.

If V1<V2, the control circuit 110 sets the voltage Vref_A to satisfy V1<Vref<Vs_A, and set the voltage Vref_B to satisfy V1<Vref<Vs_B. If the voltage Vref_A is 90% of the voltage Vs_A, the control circuit 110 sets the voltage Vref_A to the voltage as represented by the voltage Vref in the equation (2). If the voltage Vref_B is 90% of the voltage Vs_B, the control circuit 110 sets the voltage Vref_B to the voltage as represented by the voltage Vref in the equation (2).

After the charge redistribution, the control circuit 110 can test whether the capacitance element Cm1-1 is normal or abnormal depending on the logic level of the signal Cout_A. After the charge redistribution, the control circuit 110 can test whether the capacitance element Cm1-2 is normal or abnormal depending on the logic level of the signal Cout_B.

When the capacitance elements Cm1-1 and Cm1-2 are tested at the same time, the influence of the parasitic capacitance at the node Test_B is smaller than the influence of the parasitic capacitance at the node Test_A, so that the test accuracy of the capacitance element Cm1-2 having a small capacitance value can be improved.

The capacitance elements Cm1-3 to Cm1-5 are tested in the same manner as in the first exemplary embodiment. In addition, the test of the capacitance elements Cm2-1 to Cm2-5 of the second set and the capacitance elements Cm3-1 to Cm3-5 of the third set is the same as the test of the capacitance elements Cm1-1 to Cm1-5 of the first set.

In the third exemplary embodiment, the voltage at one end of the capacitance element to be tested may be changed by a buffer to redistribute the charges, and whether the capacitance element to be tested is normal or abnormal may be tested based on the logic levels of the signals Cout_A and Cout_B after the redistribution.

In the third exemplary embodiment, two systems of the comparison circuits Cmp_A and Cmp_B are provided. However, for example, three or more systems such as a system of the capacitance element Cm-1, a system of the capacitance element Cm-2, and a system of the capacitance elements Cm-3 to Cm-5 may be provided.

In addition, in the third exemplary embodiment, the capacitance elements Cm1-1 and Cm1-2 of the same set are simultaneously tested, but the capacitance elements which are simultaneously tested may be capacitance elements of different sets. For example, the capacitance elements Cm1-1 and Cm2-2 may be simultaneously tested.

Figure 6:
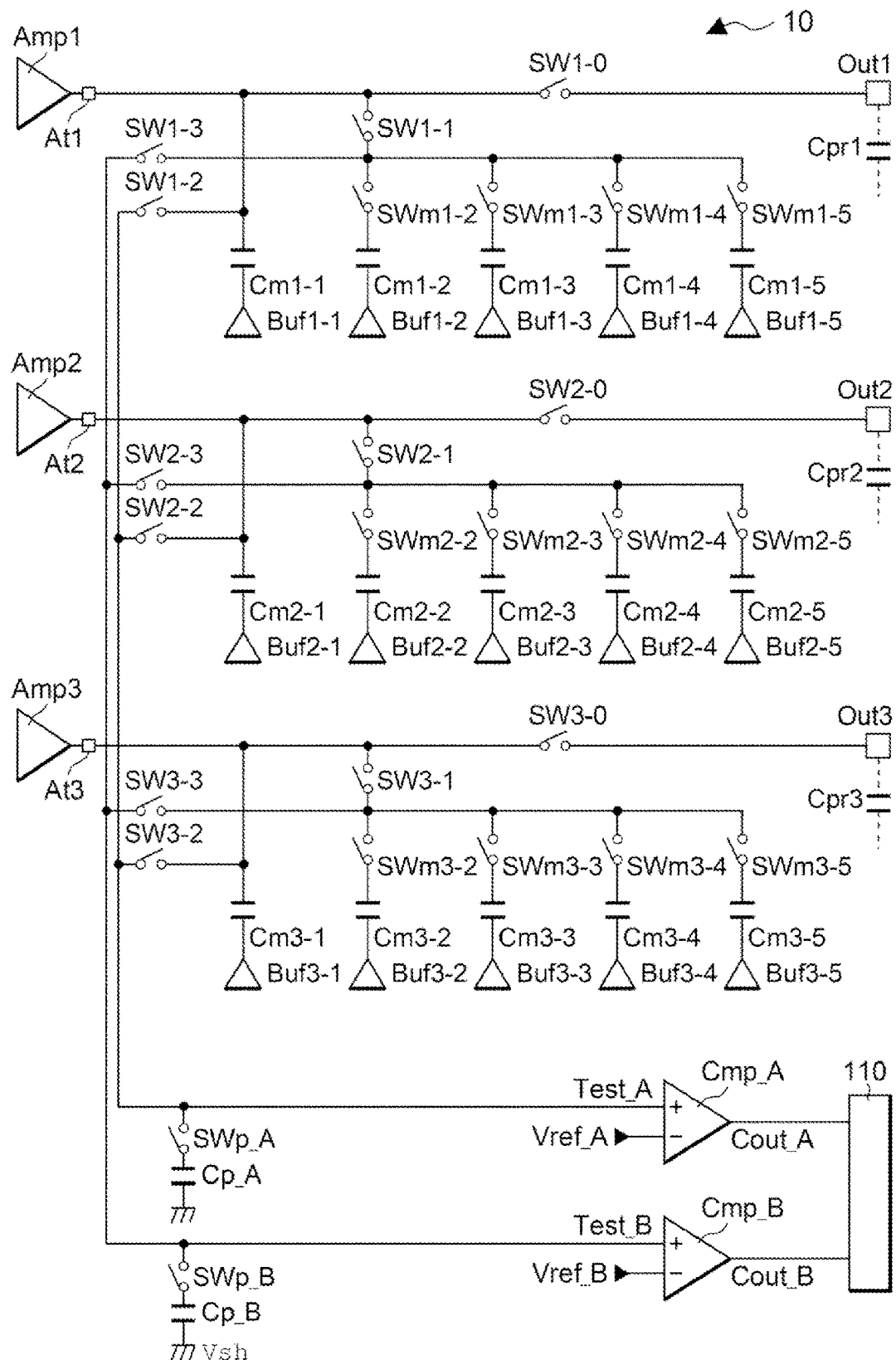
FIG. 6 is a circuit diagram of a periphery including a test circuit in a circuit device according to a modification of the third exemplary embodiment.

In the third exemplary embodiment, as illustrated in FIG. 6, the switch SW1-0 may be interposed between the output-end Out1 and the other end (switch SW1-2) of the capacitance element Cm1-1. Similarly, the switch SW2-0 may be interposed between the output-end Out2 and the other end (switch SW2-2) of the capacitance element Cm2-1, and the switch SW3-0 may be interposed between the output-end Out3 and the other end (switch SW3-2) of the capacitance element Cm3-1.

In this configuration, for example, when the charges are redistributed in the test of the capacitance element Cm1-1, the switch SW1-0 may be turned off to decouple the output-end Out1 from the node Test_A, thereby preventing the influence of the parasitic capacitance Cpr1. Similarly, when the charges are redistributed in the test of the capacitance element Cm2-1, the switch SW2-0 may be turned off to avoid the influence of the parasitic capacitance Cpr2, and when the charges are redistributed in the test of the capacitance element Cm3-1, the switch SW3-0 may be turned off to avoid the influence of the parasitic capacitance Cpr3.

In the third exemplary embodiment illustrated in FIG. 5 or FIG. 6, there are two wires, a wire to the node Test_A and a wire to the node Test_B. The capacitance of the wire to the node Test_B is smaller than the capacitance of the wire to the node Test_A.

Therefore, it is preferable that the wire to the node Test_A and the wire to the node Test_B be arranged in a single direction or a plurality of directions of up, down, left, and right. In this configuration, when the amplitude of the wire to the node Test_A and the amplitude of the wire to the node Test_B are set to the same level (for example, within two times), and the wire to the node Test_A having a small capacitance is sandwiched between the wires to the node Test_B in the vertical direction or the horizontal direction, the influence of the parasitic capacitance can be canceled.

The horizontal direction is, for example, a direction perpendicular to a direction from the amplifier circuit Amp1 to the output-end Out1 when the semiconductor substrate surface is viewed in plan. The vertical direction is a thickness direction in a cross-sectional view of the semiconductor substrate surface.

Figures 7, 8, 9, 10, 11:
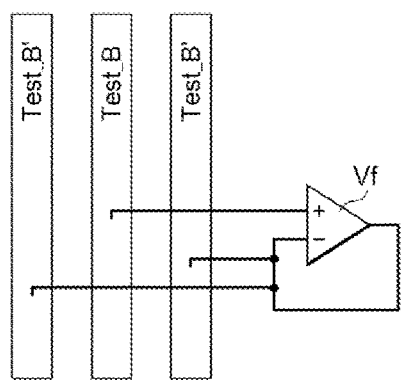
FIG. 7 is a plan view illustrating a position of a wire to a node of the circuit device according to the third exemplary embodiment.
FIG. 8 is a cross-sectional view illustrating the position of the wire to the node of the circuit device according to the third exemplary embodiment.
FIG. 9 is a cross-sectional view illustrating the position of the wire to the node of the circuit device according to the third exemplary embodiment.
FIG. 10 is a cross-sectional view illustrating the position of the wire to the node of the circuit device according to the third exemplary embodiment.
FIG. 11 is a diagram illustrating the wire, etc. to the node of the circuit device according to the exemplary embodiment, etc.

FIG. 7 is a plan view illustrating an example of the positional relationship between the wire to the node Test_A and the wire to the node Test_B, and is an example in which the wire to the node Test_B is provided on both the left and right sides of the wire to the node Test_A in plan view.

FIG. 8, FIG. 9, and FIG. 10 are cross-sectional views illustrating an example of the positional relationship between the wire to the node Test_A and the wire to the node Test_B.

Among them, FIG. 8 illustrates an example in which wires to the node Test_A are provided on both upper and lower sides of the wire to the node Test_B via an interlayer insulating film so as to sandwich the wire to the node Test_B in a sectional view. FIG. 9 is an example in which a wire to the node Test_A is provided on the upper side of a wire to the node Test_B via an interlayer insulating film and a wire to the node Test_A is also provided on the left side of the wire to the node Test_B in a cross-sectional view. FIG. 10 illustrates an example in which wires to the node Test_A are provided on both upper and lower sides of a wire to the node Test_B via an interlayer insulating film in a cross-sectional view, and wires to the node Test_A are provided on both left and right sides of the wire to the node Test_B.

Since the wire to the node Test_B has a small capacitance, the wire is easily affected by noise. Therefore, as in the configuration illustrated in FIG. 11, wires Test_B' may be arranged on both the left and right sides of the wire to the node Test_B in plan view to shield the wire to the node Test_B. In this configuration, since the voltage of the wire to the node Test_B is impedance-converted by the voltage follower Vf and applied to the wire Test_B', the voltage changes of the three wires are the same, so that noise due to the parasitic capacitance can be canceled. Although FIG. 11 illustrates an example in which the wires Test_B' are arranged on both the left and right sides of the wire to the node Test_B in plan view, the wires Test_B' may be arranged on both the upper and lower sides of the wire to the node Test_B in a sectional view.

Note that the capacitance element Cm1-1 is an example of a first tested capacitance element, the capacitance element Cm1-2 is an example of a second tested capacitance element, the capacitance element Cm2-1 is an example of a third tested capacitance element, and the capacitance element Cm2-2 is an example of a fourth tested capacitance element. The capacitance elements Cp and Cp_A are an example of a first test capacitance element, and the capacitance element Cp_B is an example of a second test capacitance element. The output-end Out1 is an example of a first output-end, and the output-end Out2 is an example of a second output-end. The comparison circuits Cmp and Cmp_A are examples of a first comparison circuit, and the comparison circuit Cmp_B is an example of a second comparison circuit. The positive input-end (+) of the comparison circuits Cmp and Cmp_A is an example of a first end, the negative input-end (−) of the comparison circuits Cmp and Cmp_A is an example of a second end, the positive input-end (+) of the comparison circuit Cmp_B is an example of a third end, and the negative input-end (−) of the comparison circuit Cmp_B is an example of a fourth end.

Next, a display device DM to which a circuit device including the test circuit 10 is applied will be described.

Figure 12:
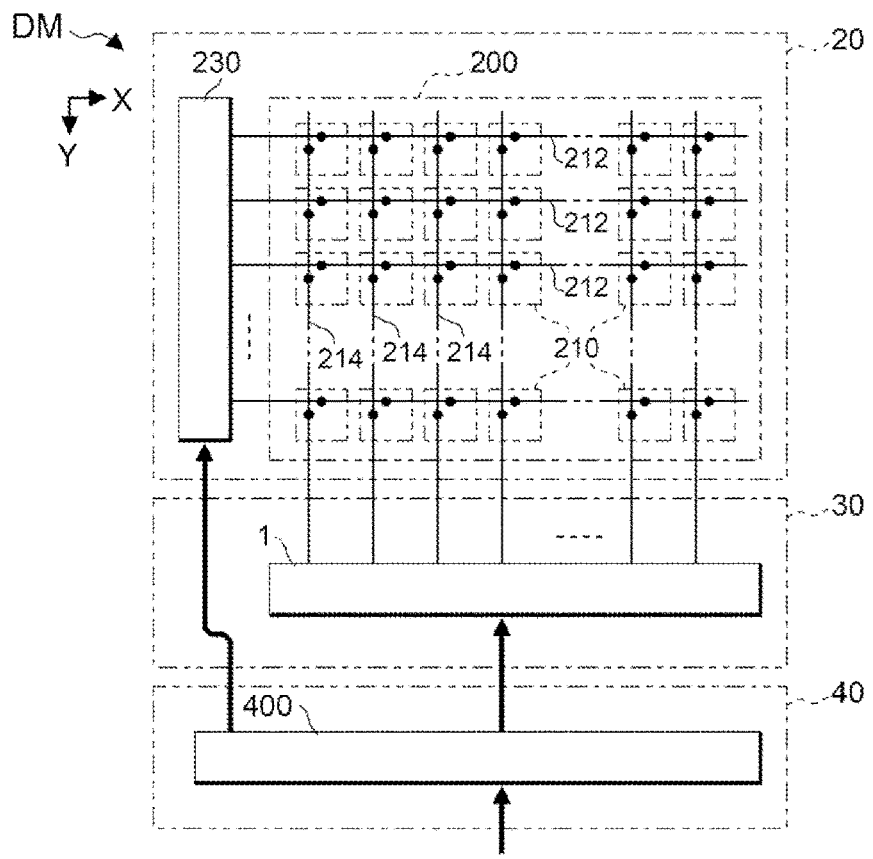
FIG. 12 is a diagram illustrating a configuration of an electro-optical device to which the circuit device according to the exemplary embodiment, etc. is applied.
Figure 13:
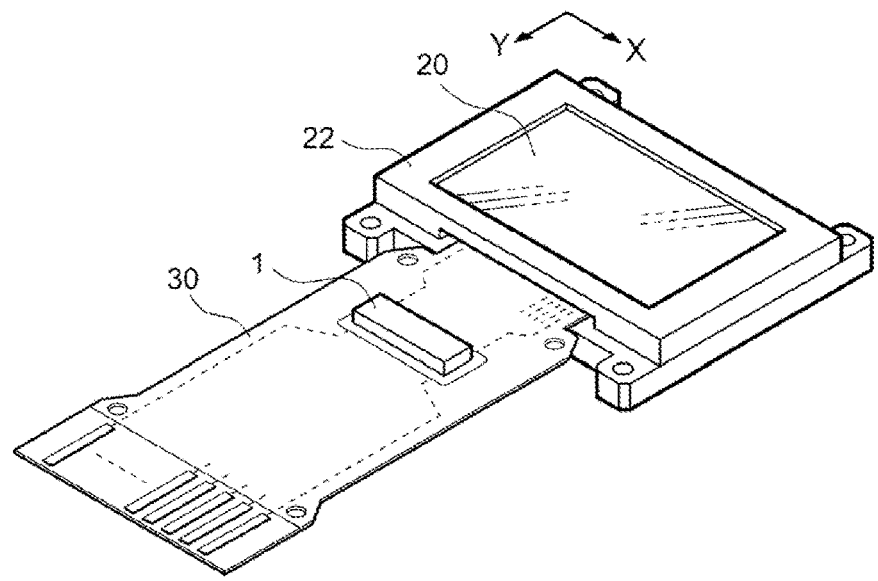
FIG. 13 is a perspective view illustrating the electro-optical device.
Figure 14:
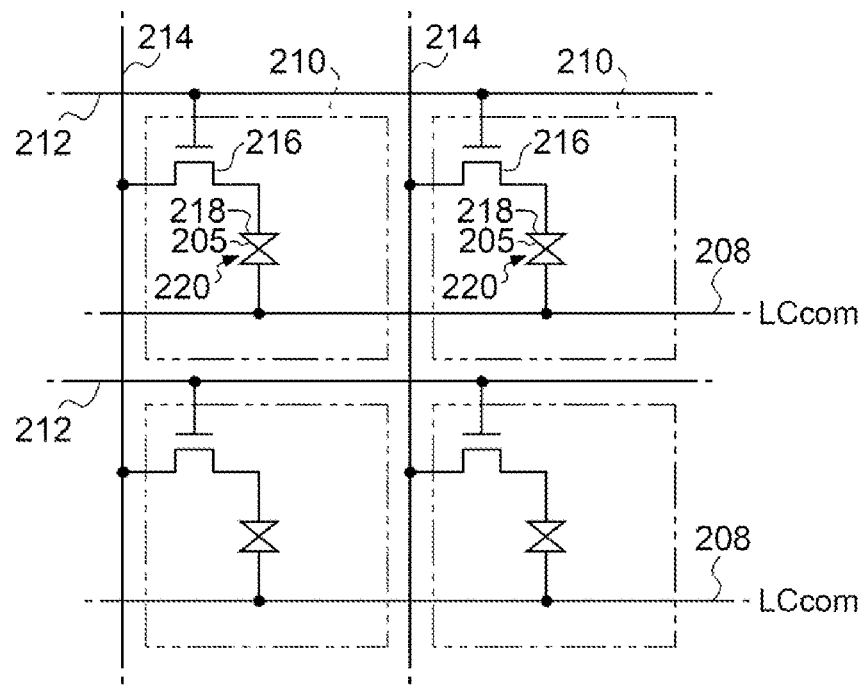
FIG. 14 is a diagram illustrating a pixel circuit in the electro-optical device.

FIG. 12 is a block diagram illustrating an electrical configuration of the display device DM, FIG. 13 is a perspective view illustrating a configuration of an electro-optical device 20, etc. in the display device DM, and FIG. 14 is a diagram illustrating a configuration of a pixel circuit 210 in the electro-optical device 20.

As illustrated in FIG. 12, the display device DM includes the electro-optical device 20, an FPC board 30, and a printed circuit board 40. Note that FPC is an abbreviation for Flexible Printed Circuits. The electro-optical device 20 is, for example, a transmissive liquid crystal panel used as a light valve of a liquid crystal projector. In the electro-optical device 20, a Y driver 230 is provided at a periphery of a display region 200. In the display region 200, pixel circuits 210 corresponding to pixels of an image to be displayed are arranged in a matrix. More specifically, in the display region 200, a plurality of scanning lines 212 are provided extending in the X direction in the drawing, and a plurality of data lines 214 are provided extending in the Y direction, while the data lines 214 are electrically insulated from the scanning lines 212. The pixel circuits 210 are provided at the intersections of the plurality of scanning line lines 212 and the plurality of data lines 214.

When the number of the scanning lines 212 is m and the number of the data lines 214 is n, the pixel circuits 210 are arrayed in a matrix of m rows and n columns. m and n are each an integer of 2 or greater. With respect to the scanning lines 212 and the pixel circuits 210, in order to distinguish the rows of the matrix from each other, the rows may be referred as a first, second, third . . . (m−1)th, and m-th row in ascending order from the top in the drawing. Similarly, with respect to the data lines 24 and the pixel circuits 210, in order to distinguish the columns of the matrix from each other, the columns may be referred as a first, second, third . . . (n−1)th, and n-th column in ascending order from the left in the drawing. The Y driver 230 selects the scanning lines 212 one by one, for example, in the order of, for example, the first, second, third . . . and m-th rows in accordance with the control signal supplied via the FPC board 30, and sets the scanning signal to the selected scanning line 212 to the H level. The Y driver 230 sets the scanning signal to the scanning lines 212 other than the selected scanning line 212 to the L level.

For convenience of description, the configuration of the pixel circuit 210 will be described.

As illustrated in FIG. 14, the pixel circuit 210 includes a transistor 216 and a liquid crystal element 220. The transistor 216 is, for example, an n-channel thin film transistor. In the pixel circuit 210, a gate node of the transistor 216 is coupled to the scanning line 212. A source node of the transistor 216 is coupled to the data line 214. A drain node of the transistor 216 is coupled to a pixel electrode 218 patterned in a substantially square shape in plan view.

A common electrode 208 is provided in common to all the pixels so as to face the pixel electrode 218. A voltage LCcom is applied to the common electrode 208. A liquid crystal 205 is sandwiched between the pixel electrode 218 and the common electrode 208. Therefore, the liquid crystal element 220 is formed by the pixel electrode 218, the common electrode 208, and the liquid crystal 205 in each pixel circuit 210.

As will be described below, in a horizontal scanning period in which a scanning signal to a certain scanning line 212 is at the H level, a data line drive circuit 240 supplies, to the pixel circuit 210 located at the scanning line 212, the data line 214 corresponding to the pixel circuit 210 with a data line signal of a voltage corresponding to a grayscale of a pixel to be expressed by the pixel circuit 210.

In the scanning line 212 in which the scanning signal is at the H level, the transistor 216 of the pixel circuit 210 provided corresponding to the scanning line 212 is turned on. Since the data line 214 and the pixel electrode 218 are electrically coupled to each other as a result of the transistor 216 being turned on, the data signal supplied to the data line 24 reaches the pixel electrode 218 through the transistor 216 that has been turned on. When the scanning line 212 is set to the L level, the transistor 116 is turned off, but the voltage of the data signal that has reached the pixel electrode 118 is held by the capacitive property of the liquid crystal element 220.

As is well known, in the liquid crystal element 220, the alignment state of the liquid crystal 205 changes according to the electric field generated by the pixel electrode 218 and the common electrode 208. Therefore, the liquid crystal element 220 has a transmittance (optical state) corresponding to the effective value of the applied voltage. Therefore, in the electro-optical device 20, the transmittance changes for each liquid crystal element 220 of the pixel circuit 210.

Such the operation of holding a voltage in the liquid crystal element 220 is performed in the order of the first, second, third . . . and m-th row, whereby the voltage corresponding to a data signal is held in each of the liquid crystal elements 220 of the pixel circuits 210 arranged in m rows and n columns. By such holding of the voltage, each of the liquid crystal elements 220 has a target transmittance, and an image including pixels arranged in m rows and n columns is generated.

As illustrated in FIG. 13, the circuit device 1 is a semiconductor chip having a substantially rectangular parallelepiped shape, and is mounted on the FPC board 30 by face-down bonding. The electro-optical device 20 is accommodated in a frame-shaped case 22 which is opened in the display region.

One end of the FPC board 30 is coupled to the electro-optical device 20. The other end of the FPC board 30 is coupled to the printed circuit board 40.

Referring back to FIG. 12, the printed circuit board 40 includes a control circuit 400. The control circuit 400 receives grayscale data and a synchronization signal from an upper circuit (not illustrated). The grayscale data digitally designates a grayscale level of a pixel in an image to be displayed by, for example, 8 bits.

The control circuit 400 supplies a control signal generated based on the synchronization signal to the Y driver 230 via the FPC board 30.

In addition, the control circuit 400 supplies a control signal generated according to the grayscale data and the synchronization signal to the circuit device 1.

The circuit device 1 includes a driver circuit that generates an analog data signal of the grayscale data for one row and supplies the data signal to each of the data lines 214, in addition to the test circuit 10 according to any one of the first to third exemplary embodiments described above. The driver includes a capacitance element to be tested.

Figure 15:
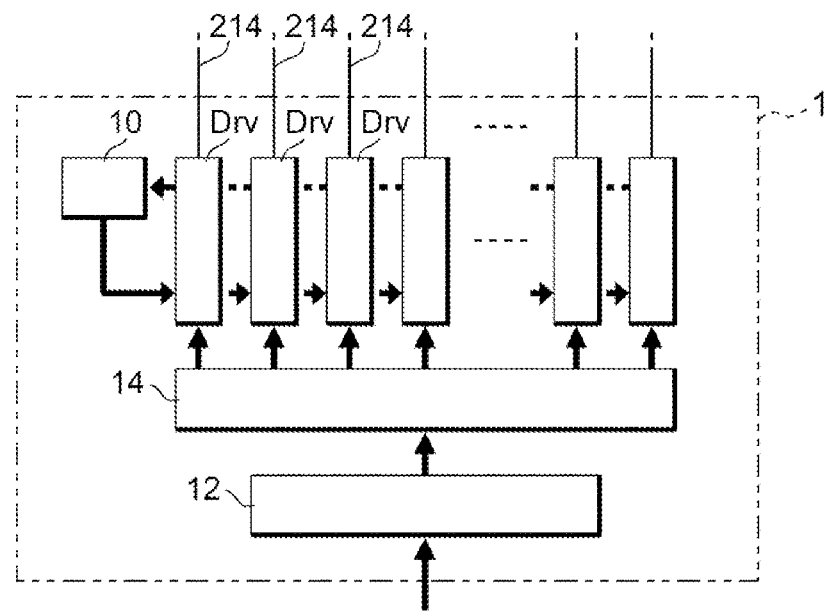
FIG. 15 is a block diagram illustrating a driver in the electro-optical device.

FIG. 15 is a block diagram illustrating a configuration of the circuit device 1. The circuit device 1 includes the test circuit 10, a plurality of drivers Drv, a data input circuit 12, and a data controller 14.

The drivers Drv are provided in one to-one correspondence with the data lines 214. When the number of the data lines 214 is n, the number of the drivers Drv is also n.

The data input circuit 12 is an interface for inputting the grayscale data and the synchronization signal supplied from the control circuit 400 via the FPC board 30. The data controller 14 distributes the grayscale data supplied via the data input circuit 12 to the n drivers Drv in accordance with the synchronization signal supplied via the data input circuit 12.

The n drivers Drv are arranged along the long side of the circuit device 1. As illustrated in FIGS. 12 and 13, since the circuit device 1 is mounted on the FPC board 30 such that the long side of the circuit device 1 is along the X direction which is the extending direction of the scanning line 212, the n drivers Drv are also provided along the extending direction of the scanning line 212.

In the circuit device 1, the test circuit 10 is provided adjacent to a region in which the n drivers Drv provided along the extending direction of the scanning line 212 are arranged. In the test circuit 10, the capacitance element included in each of the n drivers Drv is tested.

One driver Drv latches the grayscale data supplied corresponding to the column of the driver Drv and converts the grayscale data into an analog data signal. Each of the n drivers Drv, for example, simultaneously outputs the converted data signal in accordance with the selection of the scanning line 212 by the Y driver 230.

The capacitance element to be tested in the driver Drv is a capacitance element included in a DA conversion circuit that converts latched grayscale data into an analog data signal. Specifically, examples of the DA conversion circuit include the driver described in JP-A-2016-80805 and the driver described in JP-A-2016-90882. Various capacitance elements constituting these drivers can be tested.

The test circuit 10 sequentially selects the n drivers Drv one by one, further selects the capacitance elements included in the selected drivers Drv one by one in a predetermined order as test targets, and tests the selected capacitance elements.

Next, a projection-type display device will be described as an example of an electronic apparatus to which the display device DM is applied.

Figure 16:
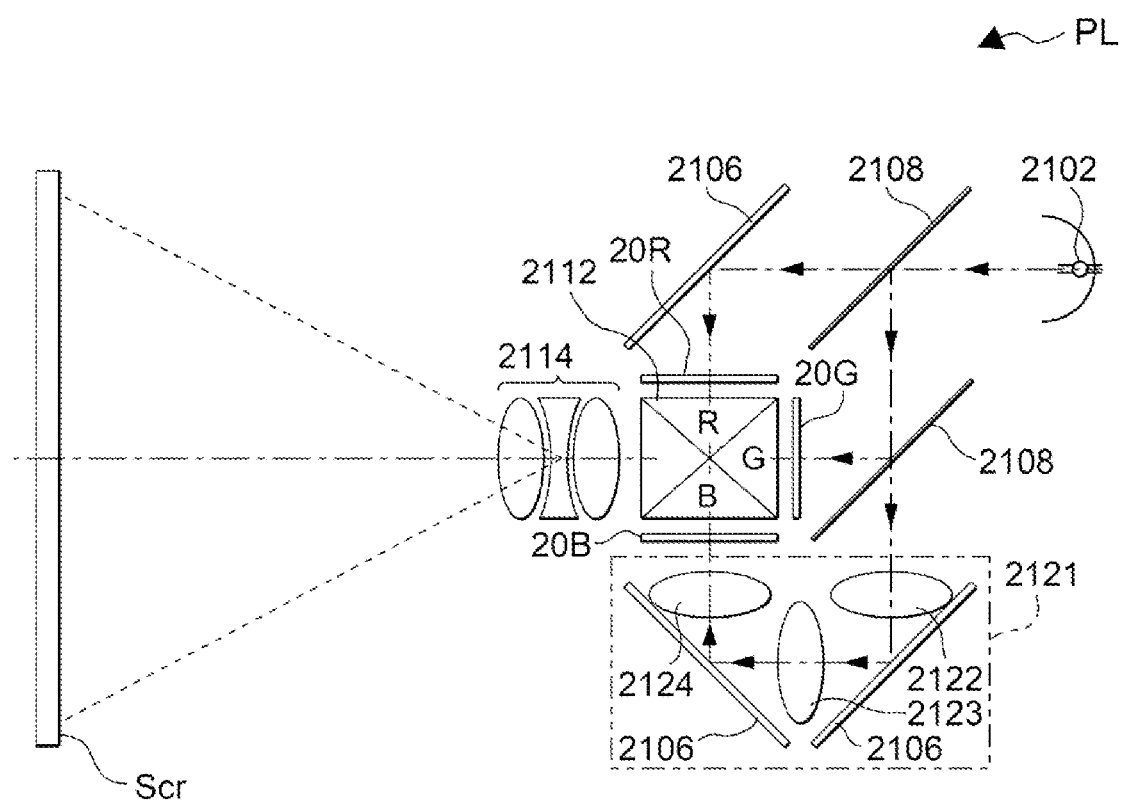
FIG. 16 is a diagram illustrating a projection-type display device to which the electro-optical device is applied.

FIG. 16 is a diagram illustrating an optical configuration of a projection-type display device PL. As illustrated in the drawing, the projection-type display device PL includes electro-optical devices 20R, 20G, and 20B.

A lamp unit 2102 formed of a white light source such as a halogen lamp is provided inside the projection-type display device PL. Projection light emitted from the lamp unit 2102 is split into three primary colors of red (R), green (G), and blue (B) by three mirrors 2106 and two dichroic mirrors 2108 disposed inside the projection-type display device PL. The light of R is incident on the electro-optical device 20R, the light of G is incident on the electro-optical device 20G, and the light of B is incident on the electro-optical device 20B.

Note that since an optical path of B is longer than each of optical paths of R and G, it is necessary to prevent a loss in the B optical path. Thus, a relay lens system 2121 including an incidence lens 2122, a relay lens 2123, and an emission lens 2124 is provided at the B optical path.

The electro-optical devices 20R, 20G, and 20B are the same as the above-described electro-optical device 20, but are distinguished by reference numerals for convenience because the colors of the incident light are different.

The liquid crystal element of the electro-optical device 20R is driven based on a data signal corresponding to R supplied from the control circuit 400 of the printed circuit board 40 via the FPC board 30, and thus has transmissivity corresponding to the voltage of the data signal.

Therefore, in the electro-optical device 20R, the transmission image of R is generated by individually controlling the transmittances of the liquid crystal elements. Similarly, in the electro-optical device 20G, a transmission image of G is generated based on a data signal corresponding to G, and in the electro-optical device 20B, a transmission image of B is generated based on a data signal corresponding to B.

The transmission images of the respective colors generated by the electro-optical devices 20R, 20G, and 20B are incident on a dichroic prism 2112 from three directions. At the dichroic prism 2112, the light of R and the light of B are refracted at 90 degrees, whereas the light of G travels in a straight line. Thus, the dichroic prism 2112 combines the images of the respective colors. The combined image formed by the dichroic prism 2112 is incident on a projection lens 2114. The projection lens 2114 enlarges and projects the composite image on a screen Scr.

The transmission images formed by the electro-optical devices 20R and 20B are projected after being reflected by the dichroic prism 2112, whereas the transmission image formed by the electro-optical device 20G travels straight and is projected. Therefore, the transmission images by the electro-optical devices 20R and 20B are in a relationship of being horizontally inverted with respect to the transmission image of the electro-optical device 20G.

In addition, the electro-optical device 20 is not limited to the liquid crystal panel, and may be applied to an organic EL panel using an OLED. In the organic EL panel, it is preferable that a semiconductor substrate constituting the organic EL panel has the function of the circuit device 1.

Although the projection-type display device PL has been exemplified as the electronic apparatus, the present disclosure is not limited thereto, and can also be applied to, for example, a display panel of a head-mounted display, an electronic viewfinder in a video camera, a lens-interchangeable digital camera, etc., a personal digital assistant, a display unit of a wristwatch, etc.

What is claimed is:

1. A circuit device comprising:
a first tested capacitance element;
a second tested capacitance element;
a first comparison circuit configured to compare a voltage at a first end with a voltage at a second end;
a first test capacitance element provided between the first end and a fixed potential;
a first operational amplifier circuit configured to output a voltage to a first output-end; and
a control circuit, wherein
the control circuit is configured to:
electrically couple the first test capacitance element and the first end to the first tested capacitance element to apply a first voltage output from the first operational amplifier circuit to the first tested capacitance element, the first test capacitance element, and the first end,
electrically decouple the first test capacitance element and the first end from the first tested capacitance element,
electrically couple the first test capacitance element and the first end to the first tested capacitance element to move a charge of the first tested capacitance element and set the second end to a first test voltage,
test the first tested capacitance element based on the first comparison circuit,
electrically couple the first test capacitance element and the first end to the second tested capacitance element to apply a second voltage output from the first operational amplifier circuit to the second tested capacitance element, the first test capacitance element, and the first end,
electrically decouple the first test capacitance element and the first end from the second tested capacitance element and the first output-end,
electrically couple the first test capacitance element and the first end to the second tested capacitance element to move a charge of the second tested capacitance element and set the second end to a second test voltage, and
test the second tested capacitance element based on the first comparison circuit.

2. The circuit device according to claim 1, wherein
the control circuit is configured to:
after the control circuit electrically decouples the first test capacitance element and the first end from the first tested capacitance element, apply a third voltage output from the first operational amplifier circuit to the first tested capacitance element,
electrically couple the first test capacitance element and the first end to the first tested capacitance element to move the charge of the first tested capacitance element,
after the control circuit electrically decouples the first test capacitance element and the first end from the second tested capacitance element, apply a fourth voltage output from the first operational amplifier circuit to the first tested capacitance element, and
electrically couple the first test capacitance element and the first end to the second tested capacitance element to move the charge of the second tested capacitance element.

3. The circuit device according to claim 1, wherein
the control circuit is configured to:
after the control circuit electrically decouples the first test capacitance element and the first end from the first tested capacitance element, shift an one end potential of the first tested capacitance element and electrically couple the first test capacitance element and the first end to the first tested capacitance element to move the charge of the first tested capacitance element, and
after the control circuit electrically decouples the first test capacitance element and the first end from the second tested capacitance element, shift an one end potential of the second tested capacitance element and electrically couple the first test capacitance element and the first end to the second tested capacitance element to move the charge of the second tested capacitance element.

4. The circuit device according to claim 1, wherein
the control circuit is configured to:
when the control circuit electrically decouples the first test capacitance element and the first end from the first tested capacitance element, electrically decouple the first test capacitance element and the first end from the first output-end.

5. The circuit device according to claim 1, comprising
a third tested capacitance element;
a fourth tested capacitance element; and
a second operational amplifier circuit configured to output a voltage to a second output-end, wherein
the control circuit is configured to:
electrically couple the first test capacitance element and the first end to the third tested capacitance element to apply a fifth voltage output from the second operational amplifier circuit to the third tested capacitance element, the first test capacitance element, and the first end,
electrically decouple the first test capacitance element and the first end from the third tested capacitance element
electrically couple the first test capacitance element and the first end to the third tested capacitance element to move a charge of the third tested capacitance element and set the second end to a third tested voltage,
test the third tested capacitance element based on the first comparison circuit,
electrically couple the first test capacitance element and the first end to the fourth tested capacitance element to apply a sixth voltage output from the second operational amplifier circuit to the fourth tested capacitance element, the first test capacitance element, and the first end,
electrically decouple the first test capacitance element and the first end from the fourth tested capacitance element and the second output-end,
electrically couple the first test capacitance element and the first end to the fourth tested capacitance element to move a charge of the fourth tested capacitance element and set the second end to a fourth test voltage, and
test the fourth tested capacitance element based on the first comparison circuit.

6. An electro-optical device comprising:
the circuit device of claim 1;
a data line;
a scanning line; and
a pixel circuit, wherein
the first output-end is provided corresponding to the data line, and
the pixel circuit is provided corresponding to the data line.

7. An electronic apparatus comprising the electro-optical device according to claim 6.

8. A circuit device comprising:
a first tested capacitance element;
a second tested capacitance element;
a first comparison circuit configured to compare a voltage at a first end with a voltage at a second end;
a second comparison circuit configured to compare a voltage at a third end with a voltage at a fourth end;
a first test capacitance element provided between the first end and a fixed potential;
a second test capacitance element provided between the third end and the fixed potential;
a first operational amplifier circuit configured to output a voltage to a first output-end; and
a control circuit, wherein
the control circuit is configured to:
electrically couple the first test capacitance element and the first end to the first tested capacitance element to apply a first voltage output from the first operational amplifier circuit to the first tested capacitance element, the first test capacitance element, and the first end,
electrically decouple the first test capacitance element and the first end from the first tested capacitance element,
electrically couple the first test capacitance element and the first end to the first tested capacitance element to move a charge of the first tested capacitance element and set the second end to a first test voltage,
test the first tested capacitance element based on the first comparison circuit,
electrically couple the second test capacitance element and the third end to the second tested capacitance element to apply a second voltage output from the first operational amplifier circuit to the second tested capacitance element, the second test capacitance element, and the third end,
electrically decouple the second test capacitance element and the third end from the second tested capacitance element and the first output-end,
electrically couple the second test capacitance element and the third end to the second tested capacitance element to move a charge of the second tested capacitance element and set the fourth end to a second test voltage, and
test the second tested capacitance element based on the second comparison circuit.

* * * * *